United States Patent [19]

Iwamuro

[11] Patent Number: 5,637,888

[45] Date of Patent: Jun. 10, 1997

[54] INSULATED GATE THYRISTOR

[75] Inventor: Noriyuki Iwamuro, Kawasaki, Japan

[73] Assignee: Fuji Electric Co., Ltd., Japan

[21] Appl. No.: 521,517

[22] Filed: Aug. 30, 1995

[30] Foreign Application Priority Data

Aug. 31, 1994 [JP] Japan .................................. 6-206267

[51] Int. Cl.$^6$ .......................... H01L 29/74; H01L 29/78
[52] U.S. Cl. ........................ 257/139; 257/144; 257/151; 257/153
[58] Field of Search ................................ 257/144, 146, 257/151, 152, 153, 139, 140

[56] References Cited

U.S. PATENT DOCUMENTS

| 4,760,431 | 7/1988 | Nakagawa | 257/144 |
| 5,091,766 | 2/1992 | Terashima | 257/144 |
| 5,281,833 | 1/1994 | Ueno | 257/147 |

FOREIGN PATENT DOCUMENTS

| 3-145163 | 6/1991 | Japan | 257/153 |
| 6-232387 | 8/1994 | Japan | 257/151 |

OTHER PUBLICATIONS

Ueno et al., "The Dual Gate Power Device Exhibiting the IGBT and the Thyristor Action", IEEE Electron Dev. Let. vol. 16, No. 7 Jul. 1995 pp. 328–329.

Temple, V.A.K., IEDM 84, pp. 282–285 (1984) "MOS controlled thyristors (MCT's)".

Momota, S., Proc. 1992 International Symp. on Power semiconductor Devices & IC's, Tokyo, pp. 28–33, "Double Gate MOS device having IGBT and MCT performances".

Seki, Y., Proc. 5th International Symp. on Power semiconductor Devices & IC's, pp. 159–164 (1993), "Dual Gate MOS Thyristor (DGMOT)".

*Primary Examiner*—Donald L. Monin, Jr.
*Attorney, Agent, or Firm*—Rossi & Associates

[57] ABSTRACT

The maximum controllable current of an insulated gate thyristors is improved by optimizing the length and sheet resistance of the poly-silicon constituting the gate electrodes. The device has an n$^-$ base layer with high resistivity, on the first surface of which is selectively formed a p type base region. The first source region, the second source region, and an n$^+$ emitter region are selectively formed in the surface layer of the p type base region. The first gate electrode is formed above the exposed area of the n$^-$ base layer, and the portion of the p type base region extending between the n$^-$ base layer and the first source region. The second gate electrode is formed above the second source region, and the portion of the p type base region extending between the second source region and the emitter region. The length of the poly-silicon constituting the gate electrodes is set at 4 mm or less or the sheet resistance of the poly-silicon is set at 70 Ω/□ or less.

14 Claims, 5 Drawing Sheets

INSULATED GATE THYRISTOR

FIELD OF THE INVENTION

The present invention relates in general to insulated gate thyristors used as power switching devices.

BACKGROUND

Thyristors have been used by virtue of their low on-voltage characteristics as indispensable devices for large capacity power conversion, and GTO (gate turn-off) thyristors are used very often today in the high-voltage large-current range. Drawbacks of the GTO thyristors, however, have also become clear. For example, the GTO thyristors require a large gate current for turning-off, that is a turn-off gain of the GTO thyristors is small, and the GTO thyristors require large snubber circuits for their safe turning-off, etc. Furthermore, since the switching speed of the GTO is low, their use has been limited to the low frequency range. In 1984, V. A. K. Temple (cf. IEEE IEDM Tech. Dig., 1984, p282) disclosed a MOS control thyristor (hereinafter referred to as "MCT") which may be classified as a voltage driven type thyristor. Since then, analysis and improvement of the MCT have been done world wide. This is because the MCT is a voltage driven type thyristor which can be driven with a much simpler gate circuit than the GTO thyristors, and since the MCT turns on at low on-voltage. Recently, new device structures have been proposed which have two insulated gate structures and operate at a thyristor mode when the devices are turned on and at an IGBT mode when the devices are turned off (cf. S. Momota et al., Proceedings of IEEE ISPSD, '92(1992), p28, and Y. Seki et al., Proceedings of IEEE ISPSD, '93(1993), p159).

FIG. 8 is a cross section of a double insulated gate MOS device (DGMOS) disclosed in 1992. In FIG. 8, the device has a $p^+$ collector layer 21 on which is formed an $n^-$ layer 23 via an $n^+$ buffer layer 22. A p type base region 24 is selectively formed in the surface layer of the $n^-$ layer 23. In the surface layer of the p type base region 24, n type base regions 25 are selectively formed. P type emitter regions 26, 26 are also selectively formed in the surface layer of each n type base region 25. An emitter electrode 27 is fixed commonly to the p type emitter regions 26 and n type base region 25. The emitter electrodes 27 are connected to the emitter terminals E. The first gate electrode 31 is fixed via a gate oxide film 28 to the exposed area of the $n^-$ layer 23, the portion of the p type base region 24 extending between the $n^-$ layer 23 and the n type base region 25, and the portion of the n type base region 25 extending between the p type base region 24 and the emitter region 26. The first gate electrode 31 is covered with an insulation film 29, and connected to the first gate terminal G1 through the opening of the insulation film 29. The second gate electrode 32 is fixed via the gate oxide film 28 to the portion of the p base region 24 extending between the n type base regions 25 and the portions of the n type base regions 25 extending between the p base region 24 and the p type emitter region 26. The second gate electrode 32 is covered with the insulation film 29, and connected to the second gate terminal G2 through the opening of the insulation film 29. A collector electrode 30 is fixed to the $p^+$ collector layer 21, and connected with a collector terminal C.

Voltages are applied to the first and second gate electrodes 31 and 32 in a manner as shown in FIG. 9. When a voltage exceeding the threshold value is applied to the terminal G1, an inversion layer is formed in the surface region of the p type base region 24 below the first gate electrode 31. As electrons pass through the inversion layer, an electron current flows into the $n^-$ layer 23 and the $n^+$ buffer layer 22. Since a positive voltage is applied to the collector electrode 30, the current which has flowed into the $n^-$ layer 23 and the $n^+$ buffer layer 22 generates a base current of a built-in PNP transistor consisted of the $p^+$ collector layer 21, the $n^+$ buffer layer 22 and the $n^-$ layer 23, and the p type base region 24. The base current modulates the conductivity of the $n^-$ layer 23 and turns on the PNP transistor. A hole current caused by the conductivity modulation generates a base current of a built-in NPN transistor consisted of the $n^+$ buffer layer 22 and the $n^-$ layer 23, the p type base region 24, and the n type base region 25. The base current drives the NPN transistor to finally operates a PNPN transistor consisted of the p+ collector layer 21, the $n^+$ buffer layer 22 and the $n^-$ layer 23, the p type base region 24, and the n type base region 25. Thus, the DGMOS of FIG. 8 is turned on through the terminal G1.

The DGMOS of FIG. 8 is turned off by removing the gate voltages applied to the gate electrodes 31 and 32 with a time lag as shown in FIG. 9. The voltage of the second gate electrode 32 grounded at the time t1 becomes negative with respect to the voltage of the gate electrode 31. As a result, an inversion layer is formed in the surface layer of the n type region 25 below the second gate electrode 32, and a p-channel MOSFET is turned on. Since the turning-on of the p-channel MOSFET causes short-circuit of the p type base region 24 and the n type base region 25, the basic structure becomes equivalent to an IGBT. Therefore, in steady state operation, the DGMOS operates in the thyristor mode through the first gate electrode 31. The DGMOS shifts to the on-state of the IGBT operation mode at the time t1 at the start of turning-off in response to negatively biassing the second gate electrode 32 with respect to the first gate electrode 31. At the time t2, 3 to 4 μsec after the IGBT operation mode starts, the DGMOS is turned off by removing the voltage applied to the first gate electrode 31 to stop the electron supply.

The device disclosed in 1993 (DGMOT) has had its on-resistance lowered by converting the p-channel device of FIG. 8 to an n-channel one. These devices are characterized by the above-described mode switching which realizes in one single device the low on-resistance of the thyristor and high speed switching of the IGBT.

However, the uneven operations inside the MCTs and the devices having two insulated gate structures suppress the maximum controllable current at such small values that these devices can not practically be used.

In view of the foregoing, it is an object of the present invention to provide an insulated gate thyristor which facilitates controlling a large current.

SUMMARY OF THE INVENTION

The objects of the present invention are achieved by an insulated gate thyristor which, in a preferred embodiment, comprises a base layer of the first conductivity type and of high resistivity; a base region of the second conductivity type selectively formed on the first surface of the base layer; a pair of first source regions of the first conductivity type selectively formed on the surface of the base region; a pair of second source regions of the first conductivity type formed on the surface of the base region between the first source regions; an emitter region of the first conductivity type formed on the surface of the base region between the second source regions; a collector layer formed on the first surface of the base layer; first gate electrodes, each of which is fixed via an insulation film to the portion of the base region extending between the first source region and the base layer; second gate electrodes, each of which is fixed via an insulation film to the portion of the base region extending between the second source region and the emitter region the first main electrode contacting with the collector layer; and the second main electrode contacting with the emitter region and the first source regions.

A buffer layer of the first conductivity type and of low resistivity may be formed between the base layer and the emitter layer.

It is preferable to cover the gate electrodes entirely or partly with wiring metal layers.

It is preferable to set the length of the area of the first gate electrode and the length of the area of the second gate electrode on which the wiring metal layer is not formed at 4 mm or less.

It is also preferable to set the sheet resistance of the first gate electrode and the sheet resistance of the second gate electrode at 70 $\Omega/\square$ or less.

Also, the gate electrodes are preferably comprised of polycrystalline silicon.

By applying a voltage to the first gate electrode, an inversion layer is formed in the surface layer of the base region. In association with this, first carriers are supplied from the second main electrode contacting with the first source regions. The first carriers function as a base current of a bipolar transistor and drive the bipolar transistor. The base layer, sandwiched between the emitter layer and the base region, constitutes with the buffer layer a base of the bipolar transistor. Then, second carriers are injected from the emitter layer. Since the injected second carriers promote electron injection from the emitter region, the main thyristor operates to electrically connect the first and second main electrodes under low on-voltage. The main thyristor consists of the collector layer, buffer layer and the base layer, base region, and the emitter region.

To turn off the insulated gate thyristor, a voltage is first applied to the second gate electrode to form a channel between the emitter region and the second source region. As the channel is formed, the second carriers injected from the collector layer flow to the emitter region via the base region, the auxiliary electrode, the second source region, and the channel. As a result, the operation of the insulated gate thyristor shifts to the IGBT mode. By lowering the potential of the first date electrode below the threshold value at this instant, the insulated gate thyristor is quickly turned off. The potential of the first gate electrode is lowered with a time lag after the voltage, higher than the threshold value, is applied to the second gate electrode.

However, the shorter the time lag, the more the device remains in the thyristor operation mode. As a result, the controllable current of the device decreases. The voltage applied to the second gate electrode is expressed by the following equations.

$Vg2=V0\times(1-\exp(-t/CR))$ $R=\rho\times L/W$

Here, V0 is 1.5 V for example; C is the capacitance of the poly-silicon of the second gate electrode; R is the resistance of the poly-silicon of the second gate electrode; $\rho$ is the sheet resistance of the poly-silicon ($\Omega/\square$); L is the length of the poly-silicon; W is the width of the poly-silicon; and t is the time.

The above equations indicate that as the capacitance and resistance of the poly-silicon increase, the rise time of the voltage applied to the second gate electrode increases and the device more slowly switches to the IGBT operation mode. As a result, the device remains in the thyristor operation mode causing current localization even when the potential of the first gate electrode is lowered below the threshold value. The capacitance, sheet resistance and width of the poly-silicon do not distribute within a semiconductor chip once the manufacturing conditions of the poly-silicon are fixed.

The resistance of the poly-silicon depends on the length of the part of the poly-silicon which is not covered with the wiring metal layer. The resistance of the poly-silicon becomes large in the remote area from the wiring metal layer for collecting a current. Also, the voltage applied to the gate electrode rises slowly in the remote area. Thus, the more remote the area, that is the longer the length of poly-silicon, the higher the poly-silicon resistance becomes, and the slower the voltage applied to the gate electrode rises. Therefore, a rise time difference of the voltage applied to the second gate electrode occurs between the nearby and remote areas of the wiring metal layer. The remote area in which the applied voltage rises slowly does not shift to the IGBT mode of operation, and current localizes in the remote area. The current localization may breakdown the device, and reduce the controllable current of the device. With increase of the sheet resistance of the poly-silicon, the poly-silicon resistance increases. When the sheet resistance of the poly-silicon is high, the resistance difference along the length of the poly-silicon is increased and the controllable current is decreased.

On the other hand, as the poly-silicon length is shortened and the sheet resistance of the poly-silicon is lowered, the poly-silicon resistance decreases. As the poly-silicon resistance is lower, the resistance difference of the poly-silicon is reduced between the nearby and remote areas from the wiring metal layer. As the resistance difference is reduced, the local rise time difference of the applied voltage is reduced. A smaller local rise time difference facilitates preventing the current localization from occurring, and increasing the controllable current of the insulated gate thyristor

DETAILED DESCRIPTION OF THE PREFERRED EMBODIMENT

Figure 1:
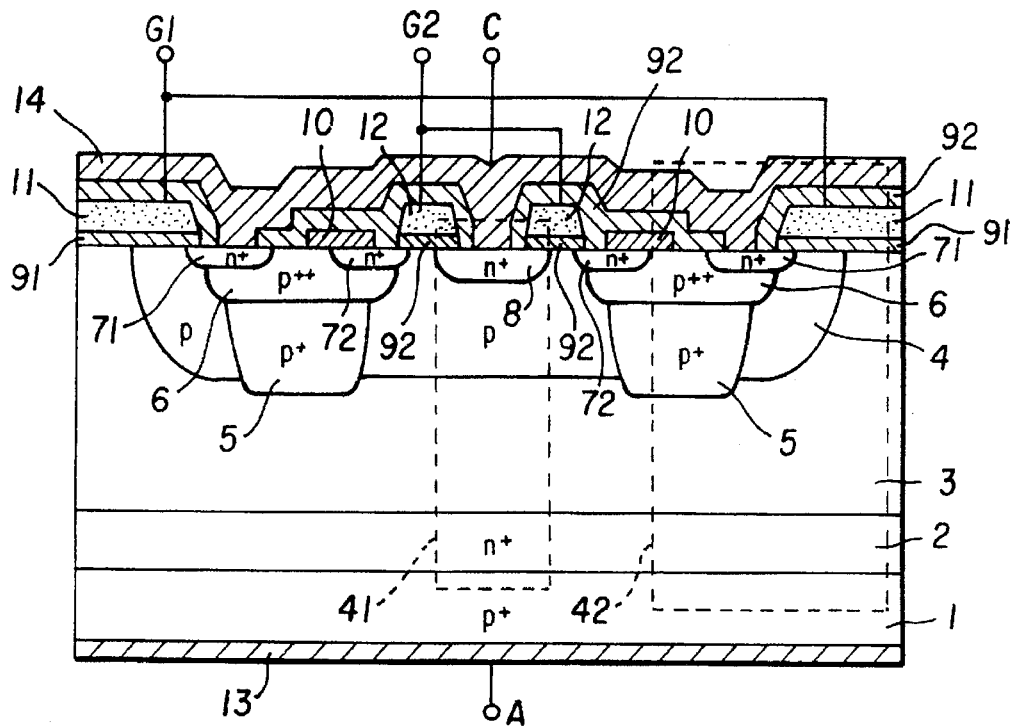
FIG. 1 is a cross section of an embodiment of an insulated gate thyristor according to the present invention.
Figure 2:
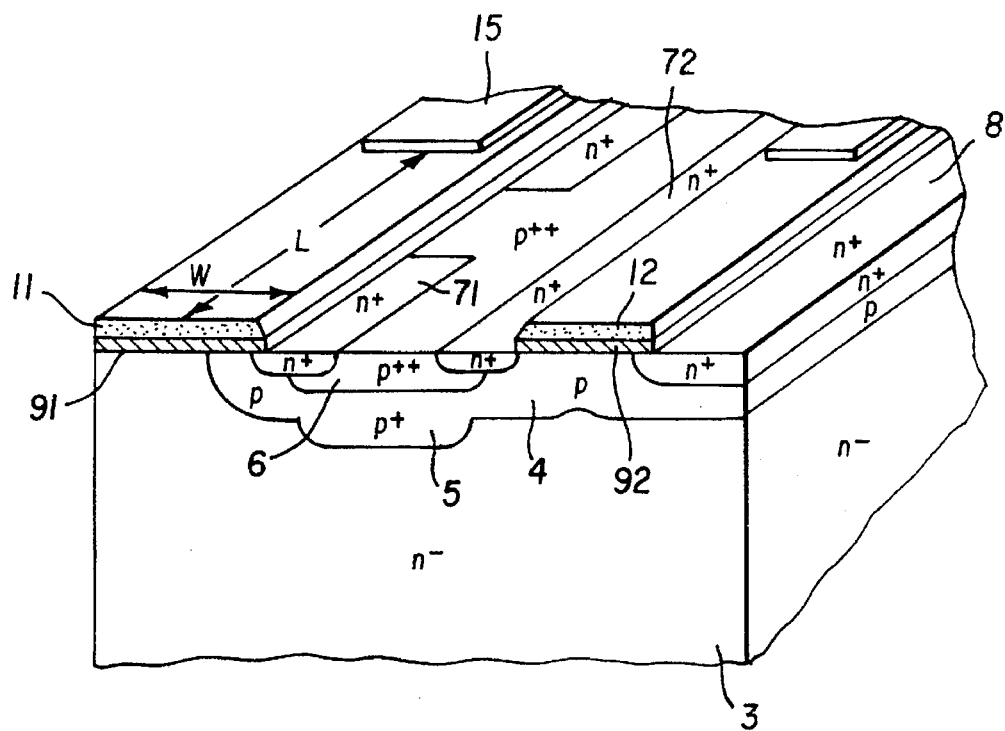
FIG. 2 is an isometric view showing the cell pattern of the insulated gate thyristor of FIG. 1.

FIG. 1 is a cross section of an embodiment of an insulated gate thyristor according to the present invention. FIG. 2 is an isometric view showing the cell pattern of the insulated gate thyristor of FIG. 1. Referring now to FIG. 1, the device has an $n^-$ base layer 3 with high resistivity, on the first surface of which is selectively formed a p type base region 4. In the p type base region 4, $p^+$ base regions 5 are formed. A $p^+$ collector layer 1 is formed on the second side of an $n^+$ buffer layer 2 laminated on the second surface of the $n^-$ base layer 3. The buffer layer 2 may be omitted.

A $p^{++}$ contact region 6 overlaps with the surface region of each $p^+$ base region 5. An $n^+$ first source region 71 and an $n^+$ second source region 72 overlap with the surface region of each $p^{++}$ contact region 6 and extend to the surface region of the $p^+$ base region 4. An $n^+$ emitter region 8 is formed in the portion of the p type base region 4 extending between a pair of the second source regions 72. The first gate electrode 11 is fixed via a gate oxide film 91 to the exposed area of the $n^-$ base layer 3, the portion of the p type base region 4 extending between the $n^-$ base layer 3 and the first source region 71, and the first source region 71. The second gate electrode 12 is fixed via a gate oxide film 92 to second source region 72, the portion of the p type base region 4 extending between the second source region 72 and the emitter region 8, and the emitter region 8. An auxiliary electrode 10 contacts in common with the second source region 72 and the $p^{++}$ contact region 6. An anode 13 as the first main electrode is fixed to the $p^+$ collector layer 1, and connected with an anode terminal A. A cathode 14 as the second main electrode contact with the first source regions 71 and the emitter region 8, and connected with a cathode terminal C. An insulation film 92 of phosphorus glass (PSG), silicon oxide, etc. isolates the first and second gate electrodes 11 and 12 from one another. The insulation film 92 also isolates each gate electrode from the second main electrode 14. The gate electrodes are made, e.g. of poly-silicon. Referring now to FIG. 2, each gate electrode is connected with a wiring metal layer 15 as shown in the figure. The wiring metal layer 15 is connected with a gate pad (not shown) which is further connected with the gate terminal G1 or G2 of FIG. 1. Here, the poly-silicon length L indicates the length between the edge of the wiring metal layer and the edge of the poly-silicon film.

The operation of the thus configured insulated gate thyristor is explained below. By applying a positive voltage to the gate electrode 11 under the state in which the cathode 14 is grounded and a positive voltage is applied to the anode 13, an inversion layer (partial storage layer) is formed beneath the gate oxide film 91 to turn on the lateral MOSFET. In association with this, electrons are supplied, at first, to the $n^-$ base region 3 from the cathode 14 via the first $n^+$ source region 71 and the channel of the MOSFET. The electrons function as a base current of a PNP transistor and drive the PNP transistor. The PNP transistor structure comprises the $p^+$ emitter layer 1/the $n^+$ buffer layer 2/the $n^-$ base layer 3/p type base layer 4 ($p^+$ base region 5). Holes are injected from the $p^+$ collector layer 1. The holes partly flow to the p type base region 4 via the $n^+$ buffer layer 2 and the $n^-$ base layer 3. Then, by boosting the potential of the p type base region 4 to promote electron injection from the $n^+$ emitter region 8, the main thyristor 41 starts operating. During thyristor operation, the second gate electrode is kept at zero potential.

To turn off the insulated gate thyristor, the lateral MOSFET is turned on by first boosting the potential of the second gate electrode 12 above the threshold value of the MOSFET. Then, the p type base region 4 is biassed at the equi-potential with the cathode 14 through the MOSFET. The holes injected from the $p^+$ collector layer 1 flow in the cathode 14 via the p type base region 4, the $p^{++}$ contact region 6, the auxiliary electrode 10, the second $n^+$ source region 72, the n channel, and the $n^+$ emitter region 8. As a result, the operation of the insulated gate thyristor shifts to the IGBT 42. By lowering the potential of the first gate electrode 11 below the threshold value at this instant, the insulated gate thyristor is turned off through the similar switching process of the IGBT. Since all the currents pass through the above described MOSFET in this operation mode, a transistor structure is left in which a part of the first $n^+$ source region 71 is not formed so that the contact region 6 may contact directly with the cathode 14 as shown in FIG. 2.

Figure 3:
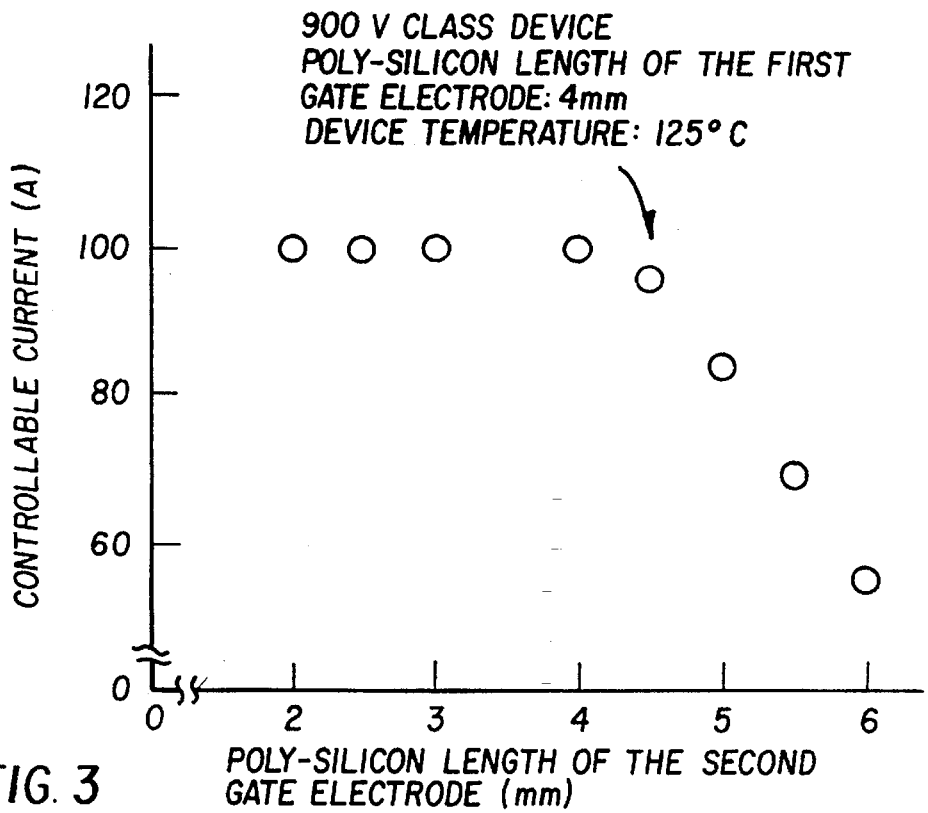
FIG. 3 shows the relation between the poly-silicon length of the second gate electrode and the controllable current of the 900 V class device of the present invention.

FIG. 3 shows the relation between the poly-silicon length L and the controllable current of an experimental insulated gate thyristor of the present invention. The experimental device was designed and manufactured as the 900 V class device. The 900 V class experimental device has a $p^+$ silicon substrate with resistivity of 0.02 Ω·cm, and thickness of 450 µm as the $p^+$ emitter layer 1 or as the $p^+$ collector layer 21. An $n^+$ layer with resistivity of 0.1 Ω·cm, and thickness of 10 µm is formed as the $n^+$ buffer layer 2 or 22. An $n^-$ layer with resistivity of 70 Ω·cm, and thickness of 80 µm is formed as the $n^-$ base layer 3 or 23. The p type base region 4 is formed by implanting ions at the dose amount of $1 \times 10^{14}$ cm$^{-2}$ and by thermally driving the implanted ions for 5 hours. The active region of the device has an area of 0.16 cm$^2$. The poly-silicon width of the first gate electrode is 20 µm. The poly-silicon width of the second gate electrode is 3 µm. The poly-silicon length of the first gate electrode 11 is 4 mm. FIG. 3 shows the relation between the poly-silicon length of the second gate electrode 12 and the controllable current measured by setting at 500 nsec the time lag from feeding the on-signal to the second gate electrode until feeding the off-signal to the first gate electrode. Other experimental parameters include the poly-silicon length of 4 mm of the first gate electrode 11, the sheet resistance of 70 Ω/□ of the first gate electrode 11, and the device temperature of 125° C. The controllable current saturates at the poly-silicon length of 4 mm or less of the second gate electrode. At the poly-silicon length of 4 mm or less, the local rise time difference of the voltage applied to the gate electrode is shortened to several hundred nsec or less. The rise time difference is caused by the difference of the poly-silicon resistance values (resistance value difference of the poly-silicon between the vicinity of and the farthest part from the gate pad). Because of the short rise time difference, the device is turned off almost simultaneously over the entire active region. Since the breakdown mode is replaced by the so-called latch-up mode in which the parasitic thyristor is turned on, the controllable current saturates.

Figure 4:
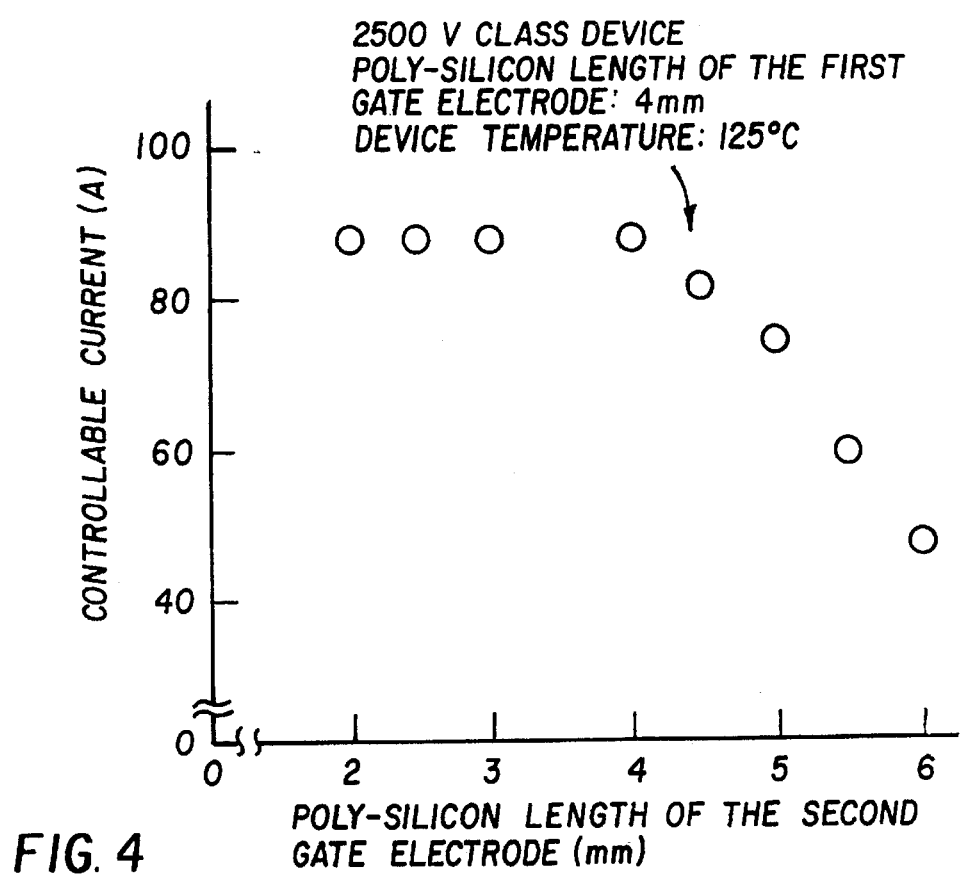
FIG. 4 shows the relation between the poly-silicon length L of the second gate electrode and the controllable current of the 2500 V class device of the present invention.

FIG. 4 shows the relation between the poly-silicon length L of the second gate electrode 12 and the controllable current of an experimental insulated gate thyristor of the 2500 V class. The 2500 V class experimental device was manufactured on a bulk silicon wafer. Similarly as in FIG. 3, the controllable current saturates at the poly-silicon length of 4 mm or less.

Figure 5:
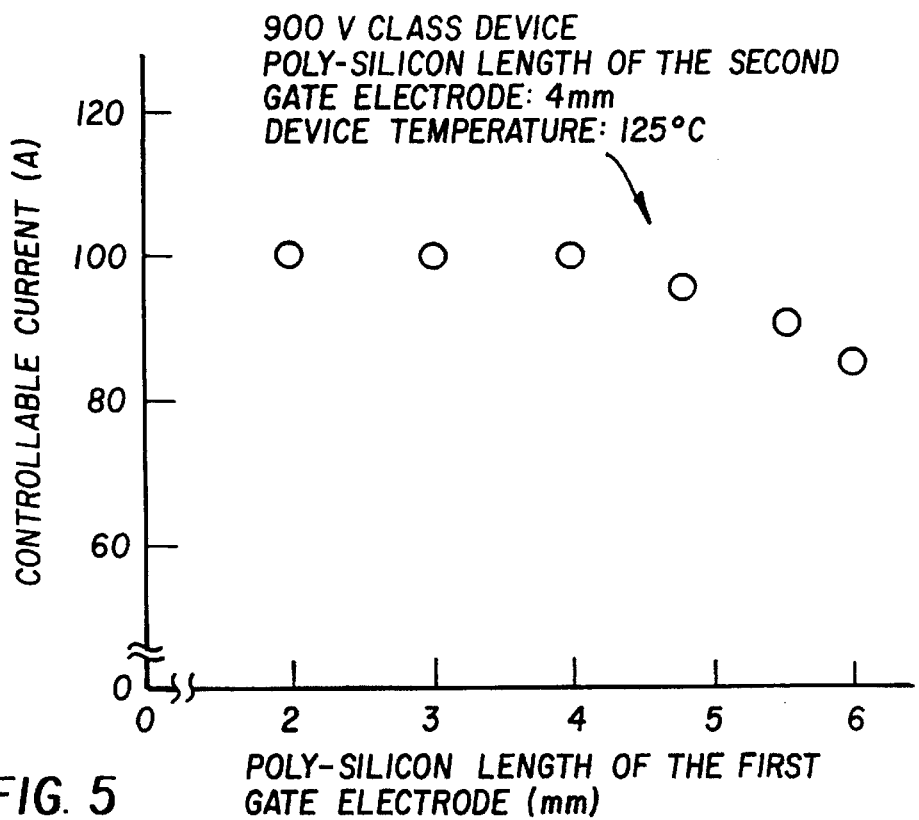
FIG. 5 shows the relation between the poly-silicon length L of the first gate electrode and the controllable current of the 900 V class device of the present invention.
Figure 6:
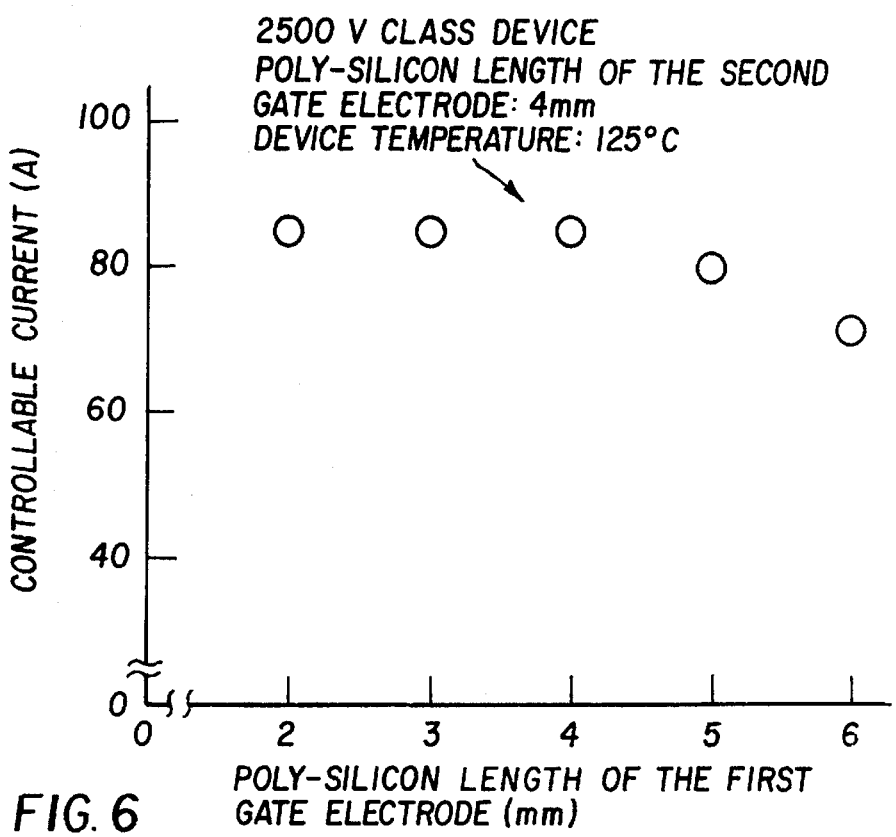
FIG. 6 shows the relation between the poly-silicon length of the first gate electrode and the controllable current of the 2500 V class device of the present invention.

FIG. 5 shows the relation between the poly-silicon length L of the first gate electrode 11 and the controllable current of an experimental insulated gate thyristor of the 900 V class with the poly-silicon length of the second gate electrode 12 fixed at 4 mm. FIG. 6 shows the relation between the poly-silicon length of the first gate electrode 11 and the controllable current of an experimental insulated gate thyristor of the 2500 V class with the poly-silicon length of the second gate electrode 12 fixed at 4 mm. in FIGS. 5 and 6, the controllable current saturates at the poly-silicon length of 4 mm or less.

Figure 7:
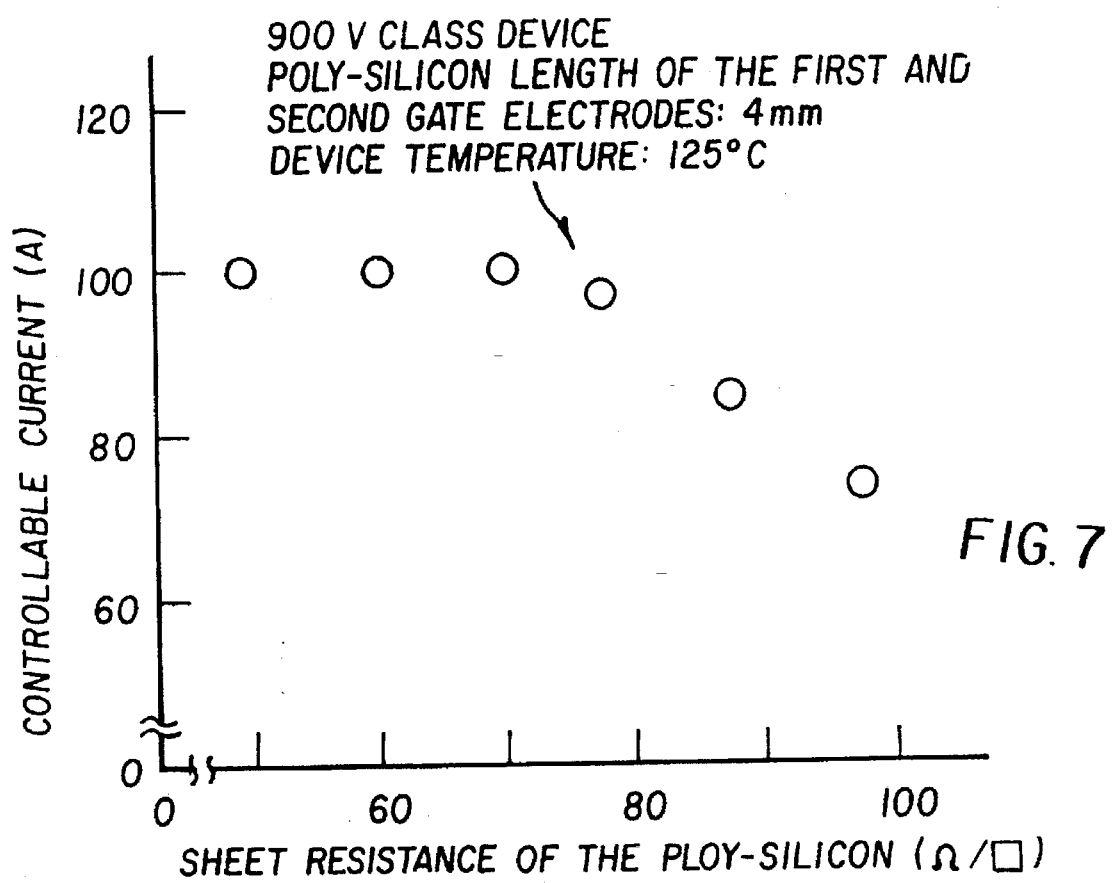
FIG. 7 shows the relation between the sheet resistance of the poly-silicon and the controllable current of the 900 V class device of the present invention.
Figure 8:
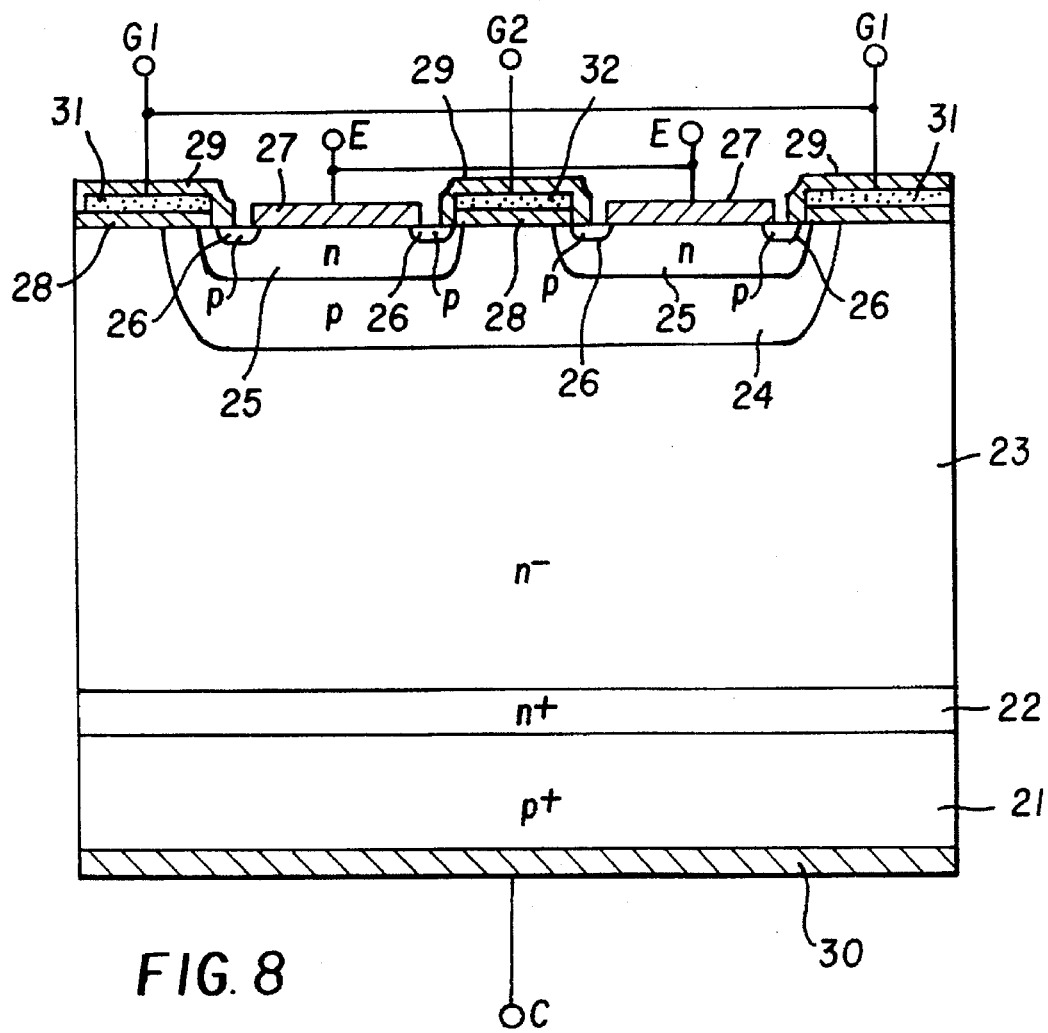
FIG. 8 is a cross section of a conventional DGMOS.
Figure 9:
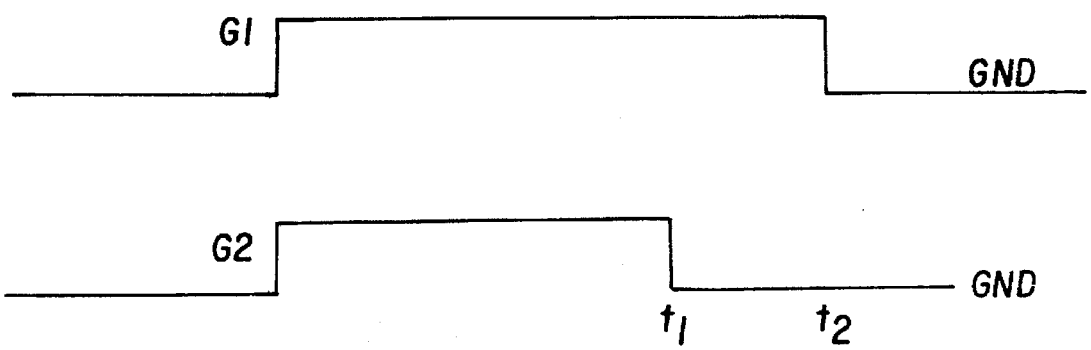
FIG. 9 is a wave chart showing the voltage for driving the insulated gate thyristor of FIG. 8.

FIG. 7 shows the relation between the sheet resistance of the poly-silicon and the controllable current of an experimental insulated gate thyristor of the 900 V class with the polysilicon length of the first and second gate electrodes 11 and 12 fixed at 4 mm. The controllable current saturates at the sheet resistance of 70 $\Omega/\square$ or less. At the sheet resistance of 70 $\Omega/\square$ or less, the local rise time difference, caused by the poly-silicon resistance difference, of the voltage applied to the gate electrode is shortened to several hundreds nsec or less. Because of the short rise time difference, the device is turned off almost simultaneously over the entire active region. Since the breakdown mode is replaced by the so-called latch-up mode in which the parasitic thyristor is turned on, the controllable current saturates.

According to the present invention, by setting the length of the first and second gate electrodes at 4 mm or less on which the wiring metal layer is not disposed and the sheet resistance of the first and second gate electrodes at 70 $\Omega/\square$ or less, insulated gate thyristors are obtained which cope with large maximum controllable currents.

What is claimed is:

1. An insulated gate thyristor comprising:

a base layer of a first conductivity type and of high resistivity;

a base region of a second conductivity type selectively formed at a first surface of said base layer;

a first source region of the first conductivity type selectively formed at the surface of said base region;

an emitter region of the first conductivity type formed at the surface of said base region;

a second source region of the first conductivity type formed at the surface of said base region between said first source region and said emitter region;

a collector layer formed on a second surface of said base layer;

a first gate electrode fixed via an insulation film to the portion of said base region extending between said first source region and said base layer;

a second gate electrode fixed via an insulation film to the portion of a surface of said base region extending between said second source region and said emitter region;

a first main electrode contacting with said collector layer; and a second main electrode contacting with said emitter region and said first source region.

2. The insulated gate thyristor as claimed in claim 1, further comprising a buffer layer of the first conductivity type and of low resistivity formed between said base layer and said collector layer.

3. The insulated gate thyristor as claimed in claim 1, further comprising wiring metal layers disposed on the entire surface of said first gate electrode and the entire surface of said second gate electrode.

4. The insulated gate thyristor as claimed in claim 1, further comprising wiring metal layers disposed on a part of said first gate electrode and a part of said second gate electrode.

5. The insulated gate thyristor as claimed in claim 1, further comprising wiring metal layers disposed on said first gate electrode and said second gate electrode leaving areas thereon, said areas having no wiring metal layers being disposed thereon, the length of each of said areas being 4 mm or less.

6. The insulated gate thyristor as claimed in claim 1, wherein the sheet resistance of each of said first gate electrode and said second gate electrode is 70 $\Omega/\square$ or less.

7. The insulated gate thyristor as claimed in claim 1, wherein said first gate electrode and said second gate electrode comprise polycrystalline silicon.

8. An insulated gate thyristor comprising:

a base layer of a first conductivity type and of high resistivity;

a base region of a second conductivity type selectively formed on a first surface of said base layer;

a pair of first source regions of the first conductivity type selectively formed on the surface of said base region;

a pair of second source regions of the first conductivity type formed on the surface of said base region between said first source regions;

an emitter region of the first conductivity type formed on the surface of said base region between said second source regions;

a collector layer formed on a second surface of said base layer;

first gate electrodes, each thereof being fixed via an insulation film to the portion of said base region extending between said first source region and said base layer;

second gate electrodes, each thereof being fixed via an insulation film to the portion of said base region extending between said second source region and said emitter region;

a first main electrode contacting with said collector layer; and a second main electrode contacting with said emitter region and said first source regions.

9. The insulated gate thyristor as claimed in claim 8, further comprising a buffer layer of the first conductivity type and of low resistivity formed between said base layer and said collector layer.

10. The insulated gate thyristor as claimed in claim 8, further comprising wiring metal layers disposed on the entire surface of said first gate electrode and the entire surface of said second gate electrode.

11. The insulated gate thyristor as claimed in claim 8, further comprising wiring metal layers disposed on a part of said first gate electrode and a part of said second gate electrode.

12. The insulated gate thyristor as claimed in claim 8, further comprising wiring metal layers disposed on said first gate electrode and said second gate electrode leaving areas thereon, said areas having no wiring metal layers being disposed thereon, the length of each of said areas being 4 mm or less.

13. The insulated gate thyristor as claimed in claim 8, wherein the sheet resistance of each of said first gate electrode and said second gate electrode is 70 $\Omega/\square$ or less.

14. The insulated gate thyristor as claimed in claim 8, wherein said first gate electrode and said second gate electrode comprise polycrystalline silicon.

* * * * *